United States Patent
Inturi et al.

(10) Patent No.: US 9,034,150 B2
(45) Date of Patent: May 19, 2015

(54) THIN FILM WITH TUNED ANISOTROPY AND MAGNETIC MOMENT

(71) Applicant: Seagate Technology LLC, Cupertino, CA (US)

(72) Inventors: Venkateswara Rao Inturi, Shakopee, MN (US); Wei Tian, Eden Prairie, MN (US); Joseph Mundenar, Eden Prairie, MN (US)

(73) Assignee: Seagate Technology LLC, Cupertino, CA (US)

(*) Notice: Subject to any disclaimer, the term of this patent is extended or adjusted under 35 U.S.C. 154(b) by 29 days.

(21) Appl. No.: 13/689,409

(22) Filed: Nov. 29, 2012

(65) Prior Publication Data

US 2014/0147702 A1  May 29, 2014

(51) Int. Cl.
| | |
|---|---|
| *C23C 14/34* | (2006.01) |
| *G11C 11/14* | (2006.01) |
| *G11B 5/64* | (2006.01) |
| *G11B 5/84* | (2006.01) |
| *B82Y 25/00* | (2011.01) |
| *G11B 5/31* | (2006.01) |
| *G11B 5/39* | (2006.01) |

(52) U.S. Cl.
CPC .......... *G11C 11/14* (2013.01); *G11B 5/647* (2013.01); *G11B 5/84* (2013.01); *B82Y 25/00* (2013.01); *G11B 5/3163* (2013.01); *G11B 5/3906* (2013.01)

(58) Field of Classification Search
CPC .... B82Y 25/00; G11B 5/3163; G11B 5/3906; G11B 5/647; G11B 5/84; G11C 11/14
USPC ....................................................... 204/192.2
See application file for complete search history.

(56) References Cited

U.S. PATENT DOCUMENTS

| | | | |
|---|---|---|---|
| 5,590,389 A | 12/1996 | Dunlop et al. | |
| 5,764,567 A | 6/1998 | Parkin | |
| 5,948,553 A | 9/1999 | Kamijo | |
| 6,139,951 A | 10/2000 | Chen et al. | |
| 6,636,460 B2 | 10/2003 | Akiyama et al. | |
| 6,740,397 B1 | 5/2004 | Lee | |
| 6,791,796 B2 | 9/2004 | Shukh et al. | |
| 6,818,961 B1 | 11/2004 | Rizzo et al. | |
| 6,908,517 B2 | 6/2005 | Segal et al. | |
| 7,061,731 B2 | 6/2006 | Larson et al. | |
| 7,258,935 B2 * | 8/2007 | Motohashi | 428/836 |

(Continued)

FOREIGN PATENT DOCUMENTS

JP    2002-151760    *  5/2002

OTHER PUBLICATIONS

Ono et al. "Texture, microstructure, and magetic properties of FeCo alloy films formed by sputtering at an oblique angle of incidence", Journal of Applied Physics 74, 5124 (1993).*
Machine Translation Shimazawa et al. dated May 2002.*

(Continued)

*Primary Examiner* — Rodney McDonald
(74) *Attorney, Agent, or Firm* — Hall Estill Attorneys at Law

(57) ABSTRACT

An apparatus and associated method are generally described as a thin film exhibiting a tuned anisotropy and magnetic moment. Various embodiments may form a magnetic layer that is tuned to a predetermined anisotropy and magnetic moment through deposition of a material on a substrate cooled to a predetermined substrate temperature.

10 Claims, 4 Drawing Sheets

(56) References Cited

U.S. PATENT DOCUMENTS 7,914,916 B2    3/2011   Inturi et al.
2002/0086182 A1  7/2002  Fujikata et al.

OTHER PUBLICATIONS

L. I. Maissel, et al., "Handbook of Thin Film Technology," New York, McGraw-Hill, Chapter 17, 1983.

R.L. Anderson, et al. "Annealing Behavior of Electroplated Permalloy Thin Films," Journal of Electronic Materials, 1973, pp. 161, vol. 2, No. 2, American Institute of Mining, Metallurgical, and Petroleum Engineers, Inc.

G. Herzer, "Grain Structure and Magnetism of Nanocrystalline Ferromagnets," IEEE Transactions on Magnetics, Sep. 1989, pp. 3327-3329, vol. 25, No. 5, IEEE.

T. Furubayashi, et al., "Structure and transport properties of current-perpendicular-to-plane spin valves using Co2FeAl0.5Si0.5 and Co2MnSl Heusler alloy electrodes," Journal of Applied Physics 107, 2010, pp. 0-7, American Institute of Physics.

S. Ikeda, et al., "Tunnel magnetoresistance of 604% at 300K by suppression of Ta diffusion in CoFeB/MgO/CoFeB pseudo-spin-valves annealed at high temperature," Applied Physics Letters 93, 2008, pp. 03-, American Institute of Physics.

V.R. Inturi, et al., "The effect of Nitrogen on Soft-Magnetism in FeTaN Films," IEEE Transactions on Magnetics, Nov. 1995, pp. 2660-2662, vol. 31, No. 6, IEEE.

H.S. Jung, et al., "FeTaN/IrMn Exchange-Coupled Multilayer Films as Soft Underlayers for Perpendicular Media," IEEE Transactions on Magnetics, Jul. 2001, pp. 2294-2297, vol. 37, No. 4, IEEE.

Andrew S. Kao, et al., "Effect of Magnetic Annealing on Plated Permalloy and Domain Configurations in Thin-Film Inductive Head," IEEE Transactions on Magnetics, Nov. 1991, pp. 4452-4457, vol. 27, No. 6, IEEE.

Ladislav Pust, et al., "Domain control in magnetic shields using patterned permanent magnet underlayer," Journal of Applied Physics, May 2002, pp. 6940-6942, vol. 91, No. 10, American Institute of Physics.

R.A. Ristau, et al., "On the relationship of high coercivity and L10 ordered phase in CoPt and FePt thin films," Journal of Applied Physics, Oct. 1999, pp. 4527-4533, vol. 86, No. 8, American Institute of Physics.

W. Bruckner, et al., "Evolution of stress and microstructure in NiFe (20 wt.%) thin films during annealing," Thin Solid Films 385, 2001, pp. 225-229, Elsevier Science B.V.

Liang Dong, et al., "Stress relaxation and misfit dislocation nucleation in the growth of misfitting films: A molecular dynamics simulation study," Journal of Applied Physics 83, Jan. 1998, pp. 217-227, American Institute of Physics.

De-Hua Han, "Stress effects on exchange coupling field, coercivity, and unaxial anisotropy field of NiO/NiFe bilayer thin film for spin valves," Journal of Applied Physics 81, Apr. 1997, pp. 4519-4521, American Institute of Physics.

D.W. Hoffman, "Perspective on stresses in magnetron-sputtered thin films," J Vac. Sci. Technol. A 12(4), Jul./Aug. 1994, pp. 953-961, American Vacuum Society.

R. Koch, "The intrinsic stress of polycrystalline and epitaxial thin metal films," J. Phys.: Condens. Matter 6, 1994, pp. 9519-9550, IOP Publishing Ltd., UK.

Shiyun Ruan, et al., "Kinetic Monte Carlo simulations of nanocrystalline film deposition," Journal of Applied Physics 107, 2010, pp. 1-11, American Institute of Physics.

\* cited by examiner

FIG. 3
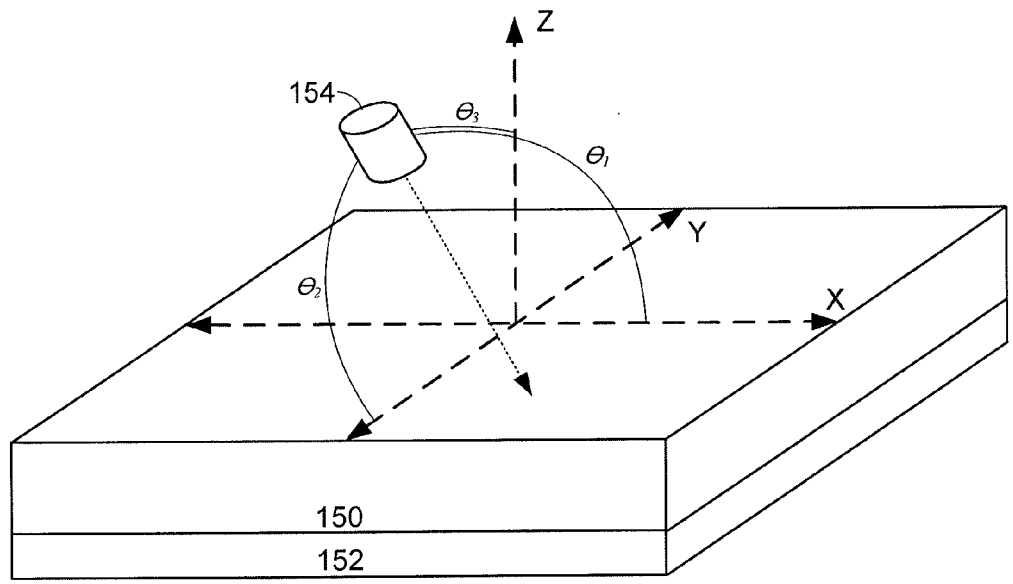
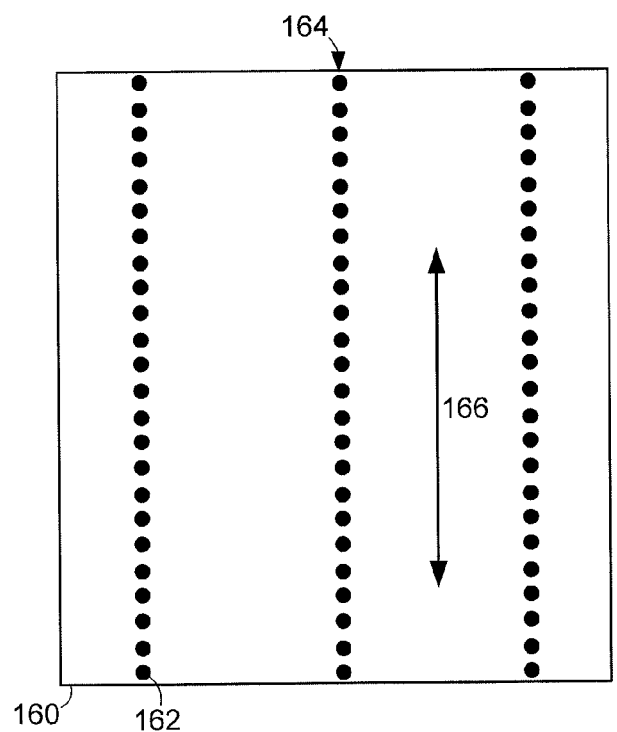
FIG. 4

THIN FILM WITH TUNED ANISOTROPY AND MAGNETIC MOMENT

SUMMARY

Various embodiments of the present disclosure are generally directed to a thin film that is tuned for various magnetic characteristics. In accordance with various embodiments, a magnetic layer is tuned to a predetermined anisotropy and magnetic moment and is formed over a cryogenic substrate.

BRIEF DESCRIPTION OF THE DRAWINGS

FIG. 3 shows an isometric block representation of an example magnetic layer in accordance with some embodiments.

FIG. 4 displays a top view block representation of an example magnetic layer tuned in accordance with various embodiments.

DETAILED DESCRIPTION

Continuing emphasis for larger capacity, faster data storage devices has stressed the magnetic stability of data storage elements, especially in smaller form factor devices. High uniaxial anisotropy and magnetic moment may aid in mitigating performance instabilities, in thin film magnetic layers used in a variety of rotating and solid state data storage devices. However, uniaxial anisotropy can be difficult to maintain in magnetic thin films subsequent to heat treatment that may occur during manufacturing or operation. Hence, industry is striving to provide thermally stable magnetic thin films capable of preserving uniaxial anisotropy and magnetic moment despite exposure to elevated temperatures.

Accordingly, a thin film may be constructed as a magnetic layer that is tuned to a predetermined anisotropy and magnetic moment through deposition of a material on a substrate cooled to a predetermined substrate temperature and with a predetermined deposition incidence angle. The ability to provide predetermined uniaxial anisotropy and magnetic moment in a magnetic layer by adjusting the temperature of a substrate on which the magnetic layer is deposited can allow the magnetic layer to be tuned to perform in a variety of different magnetic operating environments, such as small form factor data reading and writing.

The construction of a magnetic thin film in accordance with various embodiments may at least increase high frequency magnetic performance through coherent magnetic rotation while boosting robustness of the thin film's thermal stability. The deposition of one or more thin films on a substrate cooled to cryogenic temperatures, such as 50K, can control magnetic domain structure, which may maintain stress anisotropy in obliquely sputtered thin films and correspond to increased thermal and anisotropic stability. With a cryogenically cooled substrate, oblique incidence angle tuning may further increase the thermal and anisotropic stability by precisely controlling the anisotropy and magnetic moment of the thin film.

Figure 1:
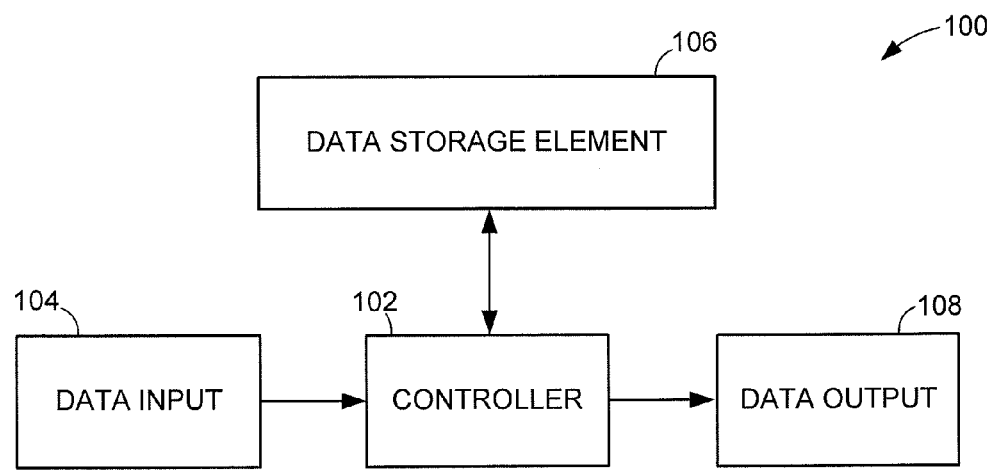
FIG. 1 is a block representation of an example data storage device in accordance with some embodiments.

Turning to the drawings, FIG. 1 generally illustrates a block representation of an example data storage device 100. The data storage device 100 may take the form of a variety of different data storage technologies, such as rotating, solid state, and hybrid systems, which can be practiced in a variety of non-limiting mobile, server, and residential environments. The data storage device 100 may be configured at least with a controller 102 that directs inputted data signals 104 to a data storage element 106. The inputted data signals 104 may originate at an unlimited variety of locations, such as from external data storage devices and internal data cache, and correspond to data intended to be stored either temporarily or permanently on the data storage element 106.

It should be noted that the size, speed, type, and number of data storage elements 106 are not limited to a particular configuration. That is, any storage element capable of retaining data for future access, such as a rotating data media, solid state cell, and hybrid data system, can be used to provide any data capacity and transfer speed configuration as the data storage element 106 either alone or in combination. Regardless of the type and capacity of the data storage element 106, the controller 102 may be capable of handling the inputted data 104 as well as providing data output signals 108 from the data storage element 106. As such, the controller 102 can selectively input data to and output data from one or more regions of the data storage element 106, either successively or concurrently.

In some embodiments, the data storage element 106 is constructed with at least one thin film magnetic layer that is magnetically fixed or free to allow data to be stored, written, and read via the controller 102. For example, the thin film magnetic layer may be a part of a magnetoresistive lamination used to sense data programmed as data bits on a rotating data media. In another example, the thin film magnetic layer may be part of a solid state lamination, such as resistive random access memory (RRAM), that stores data with the formation of a filament between two electrodes.

Figure 2:
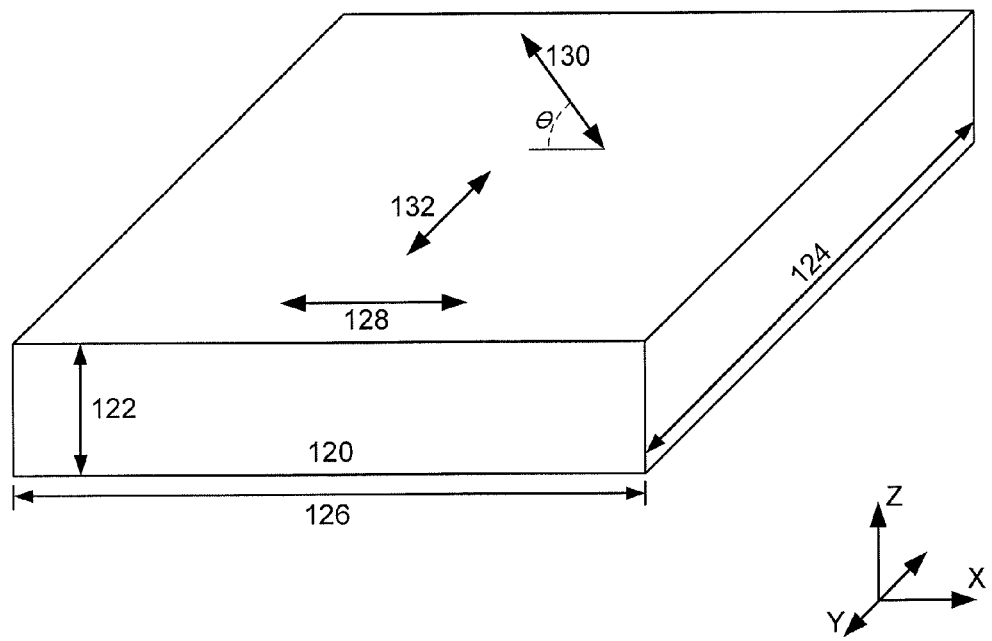
FIG. 2 provides an isometric block representation of a portion of a data storage device in accordance with various embodiments.

FIG. 2 displays an isometric block representation of an example thin film magnetic layer 120 capable of being used in the data storage element 106 of FIG. 1. The magnetic layer 120 is shown in a rectangular form with a thickness 122, stripe height 124, and width 126, but such shape and the particular dimensions of the layer 120 are not limited to a particular configuration. Regardless of the shape and dimensions of the magnetic layer 120, a uniaxial anisotropy 128 that is parallel to the transverse direction of the magnetic layer 120 and the X axis may be constructed to increase magnetic domain control versus omniaxial anisotropy.

Such a uniaxial anisotropic orientation may allow for magnetically stable performance at predetermined magnetic flux densities, such as 2.4 Tesla. However, the uniaxial anisotropy 128 may alternatively be tuned to an angled orientation 130 with respect to both the X and Y axis to maintain magnetic performance of the layer 120 when the stripe height 124 is increased. In other words, an increasingly stripe height 126 can correspond with elevated magnetic instability that is mitigated by tilting the orientation of the uniaxial anisotropy 128 to the angled uniaxial anisotropy 130 oriented non-normal to the X and Y axis.

As the stripe height 124 reaches a predetermined length, such as twice the width 126, a uniaxial anisotropy 132 oriented at an angle normal to the X axis may be formed in the magnetic layer 120 to bolster magnetic stability. For example, orienting the uniaxial anisotropy parallel to the width of the magnetic layer 120 along the X axis may lower erasure after write phenomenon as the anisotropy 128 allows magnetization to relax faster than if the anisotropy was oriented along the X axis, as in anisotropy 132, or angled to the X axis, as in anisotropy 130.

While the orientation of the uniaxial anisotropy of the magnetic layer 120 can be tuned along with the dimensions of the magnetic layer 120 to provide predetermined magnetic characteristics, the application of heat to the magnetic layer, such as during annealing or operation, can permanently alter the anisotropy and magnetic moment of a magnetic layer 120, regardless of how the anisotropy and magnetic moment was configured prior to the application of heat. With the application of heat inducing anisotropy and moment instability in the magnetic layer 120, tuning the temperature of the substrate on which the magnetic layer 120 is deposited and the angle in which the magnetic layer 120 is deposited can aid in maintaining anisotropy and moment characteristics subsequent to an application of heat.

FIG. 3 shows an isometric block representation of the deposition of a magnetic layer 150 onto a substrate 152 in accordance with various embodiments. As with the magnetic layer 120 of FIG. 2, the magnetic layer 150 can be formed in any variety of shapes, dimensions, and materials, but in some embodiments is a rectangular thin film formed through the sputtered deposition of FeCo onto the substrate 152 at a predetermined oblique incidence angles $\theta_1$, $\theta_2$, $\theta_3$ that can range from 0 up to 90 degrees with respect to the Z axis.

Static or dynamic oblique angle sputtering, such as angles at or below 30 degrees, can produce elevated anisotropy, such as 200 Oe or above due to stress anisotropy being created by the agglomeration of vacancies and nano-voids formed behind growing crystallites due to shadowing effects of the oblique angle, without losing the inherent magnetic moment of the material. That is, growing crystallites block the line of sight from the incident beam of the sputtering gun 154 to produce vacancies in predictable locations that collectively produce stress anisotropy which leads to magnetic anisotropy in the film.

The magnetic layer 160 of FIG. 4 generally illustrates how vacancies 162 align in predictable rows 164 aligned with a predetermined anisotropy direction 166 to produce uniaxial anisotropy along that direction 166. However, the thermal stability of the rows 164 becomes unstable in the presence of elevated heat as stress anisotropy lowers. Hence, conditions like annealing or heat treating the magnetic layer 160 can disturb the strength and direction of the uniaxial anisotropy. It should be noted that the material of the magnetic layer may be doped with a larger atomic radius element to mitigate thermal instability, but such efforts often lower the overall magnetic moment of the magnetic layer 160 to the detriment of high frequency data bit access operations.

With the thermal instability of uniaxial anisotropy in mind, cooling the substrate, such as substrate 152 of FIG. 3, on which the magnetic layer 160 is deposited can reduce atomic mobility and more easily form vacancies 162 and nano-voids, which corresponds to increased thermal stability of the vacancy 162 alignment along the predetermined anisotropy direction 166. In various embodiments, the anisotropy and magnetic moment are tuned by cryogenically cooling the substrate to a predetermined temperature, such as approximately 50 Kelvin, while the oblique angle of deposition is controlled.

Figure 5:
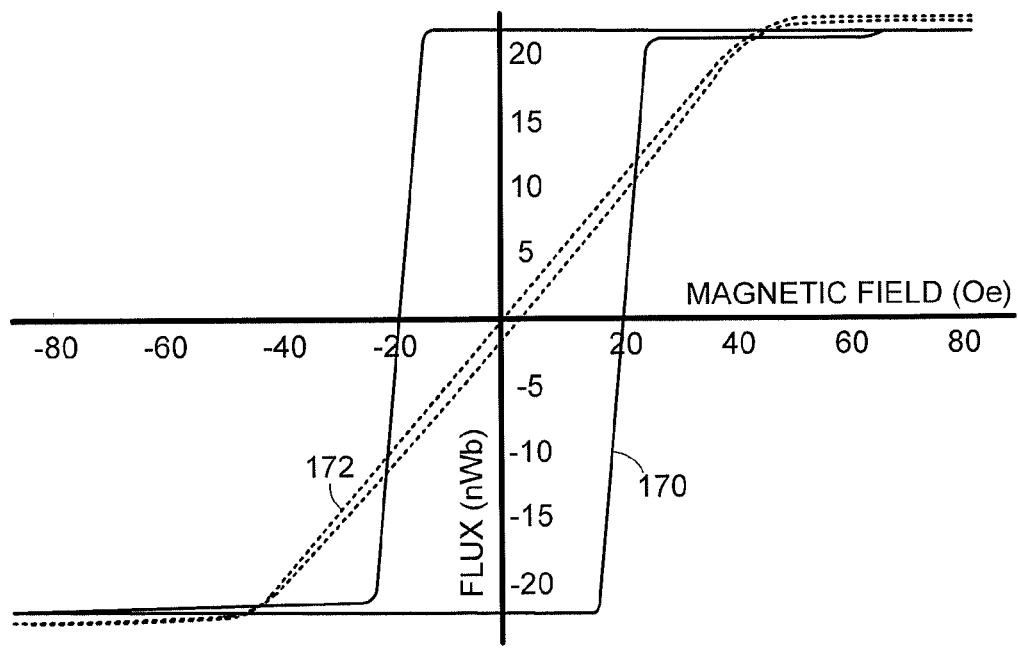
FIG. 5 plots performance data generally associated with magnetic elements constructed and operated in accordance with various embodiments.
Figure 6:
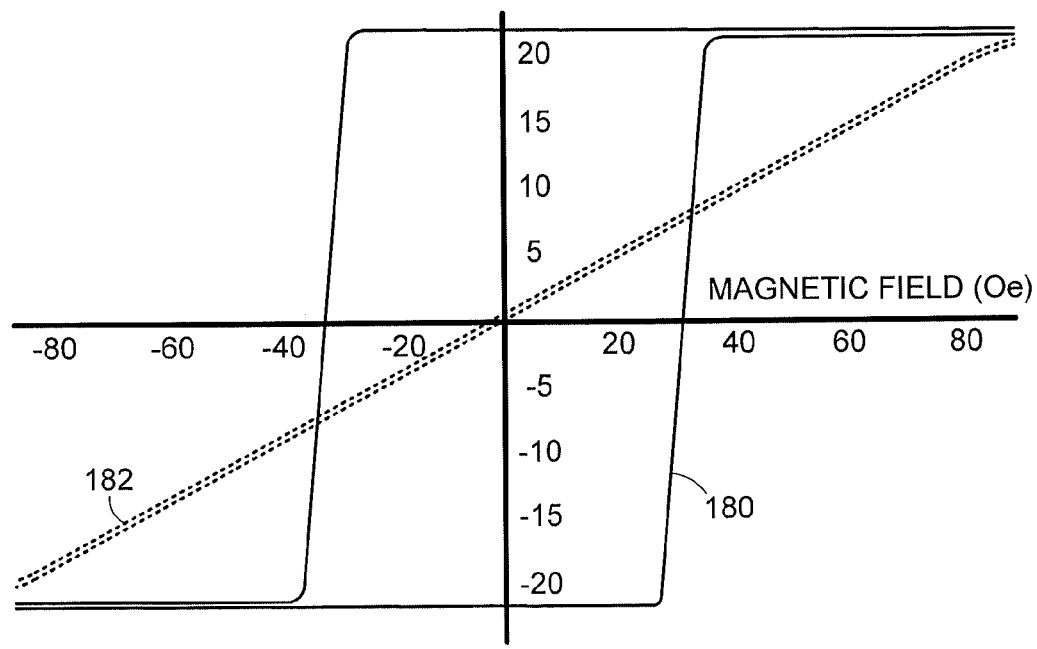
FIG. 6 graphs various operational characteristics of a magnetic element constructed and operated in accordance with various embodiments.

Such tuned deposition can provide constant or varying cryogenic substrate temperatures and oblique deposition angles optimized to produce elevated stress anisotropy can mitigate the detrimental effects of annealing and heat treatments by maintaining high uniaxial anisotropy and magnetic moment subsequent to applications of heat. FIGS. 5 and 6 respectively graph example operational data associated with magnetoresistive laminations including differently tuned magnetic layers in accordance with various embodiments. In FIG. 5, oblique deposition on a room temperature substrate is shown to provide easy 170 and hard 172 axis that is tuned to predetermined uniaxial anisotropy and magnetic moment characteristics.

While the magnetic characteristics of FIG. 5 can be altered by adjusting the oblique incidence angle of deposition, subsequent heat treatment or annealing may reduce or eliminate the tuned anisotropy and magnetic moment as vacancies in one or more magnetic layers move in crystal lattices due to thermal stresses induced by the application of heat. In contrast, the easy 180 and hard 182 axis shown in FIG. 6 illustrate how tuning both oblique incidence angle and substrate temperature can produce increased uniaxial anisotropy, which is also more thermally stable due to reduce atomic mobility of the deposited magnetic material on a cryogenically cooled substrate.

Figure 7:
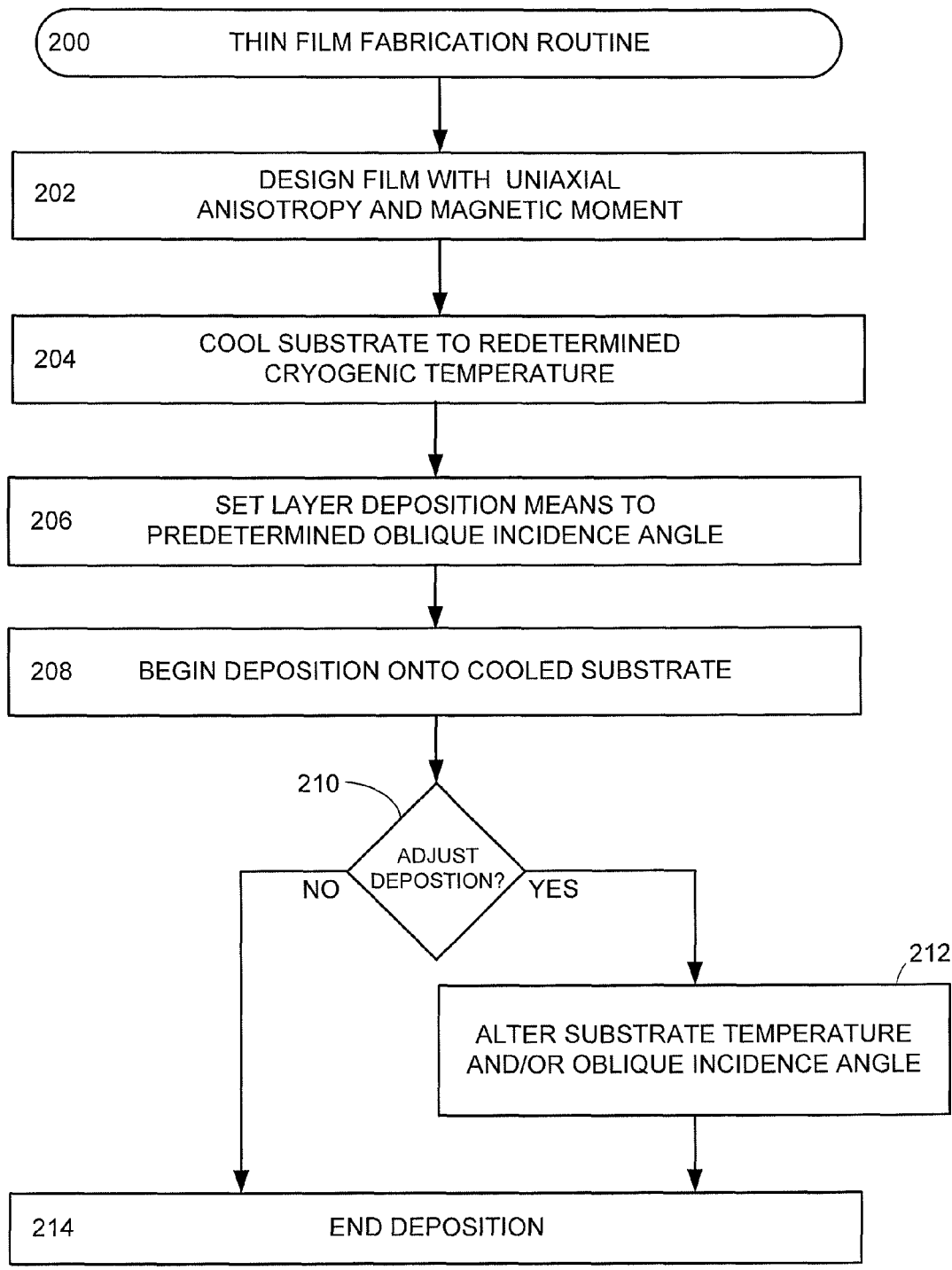
FIG. 7 provides a flowchart of a thin film fabrication routine conducted in accordance with various embodiments of the present invention.

While formation of a magnetic element comprising a tuned magnetic layer is not limited to a particular means, FIG. 7 provides an example thin film fabrication routine 200 performed in accordance with various embodiments. The routine 200 may begin by designing uniaxial anisotropy and magnetic moment that corresponds with magnetic performance optimized for application in step 202. That is, the anisotropy and magnetic moment can be designed in step 202 to provide magnetic characteristics, such as anisotropy direction and magnetic flux capacity, catered to the manner in which the thin film is to be used, such as a solid state lamination, magnetoresistive lamination, and proximity sensor.

With the uniaxial anisotropy and magnetic moment designed in step 202, oblique incidence angle and substrate temperature that corresponds to those magnetic parameters are then set for execution in steps 204 and 206, respectively. Step 204 first cools and maintains the substrate to a cryogenic temperature before step 206 configures a layer deposition means, such as a sputtering apparatus, to a predetermined oblique incidence angle. The configuration of the substrate to a cooled temperature and an oblique deposition set to a predetermined angle advances the routine 200 to step 208 where deposition of the thin film onto the cooled substrate begins.

Sometime after the start of material deposition in step 208, the deposition is evaluated in decision 210 as to whether adjustment of the substrate temperature or oblique incidence angle is to be adjusted. That is, whether the previously static substrate temperature and oblique incidence angle are to become dynamic while material is being deposited onto the substrate. If the determination from decision 210 is that modification is in order, step 212 alters the substrate temperature and/or the oblique incidence angle either individually or collectively while depositing material onto the cooled substrate.

The formation of the thin film in a predetermined shape, thickness, width, and stripe height either after the alteration of the deposition parameters in step 212 or without alteration from decision 210 leads to step 214 where the deposition is terminated. Various embodiments maintain the substrate at a cryogenic temperature even after deposition while other embodiments submit the newly formed thin film to annealing heat treatments at elevated temperatures, both of which are not required or limiting to routine 200.

While not provided in routine 200, the thin film may be fabricated in isolation or as part of a lamination where additional layers are deposited atop the tuned thin film formed in routine 200. It should be noted that the routine 200 is not limited to the process shown in FIG. 7 as various decisions and steps can be omitted, changed, and added. For example, multiple adjustments can be made to oblique incidence angle and/or substrate temperature between steps 208 and 214. Regardless of the manifestation of routine 200, the fabricated thin film is tuned with a uniaxial anisotropy direction, anisotropy strength, and magnetic moment that is optimized for stability, especially in regard to retaining magnetic characteristics after the application of heat.

It can be appreciated that the configuration and material characteristics of the magnetic thin film described in the present disclosure allows for a magnetic layer optimized for anisotropic and thermal stability. The ability to tune the magnetic layer for increased uniaxial anisotropy with oblique incidence angle deposition combines with deposition onto a cryogenically cooled substrate to provide a robust magnetic thin film capable of increasing data bit capacity and data transfer rates of data storage devices. Additionally, it will be appreciated that the claimed technology can readily be utilized in any number of magnetic applications, such as data sensing, data writing, and solid state data storage applications.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A method comprising:
   cooling a substrate to a cryogenic substrate temperature; and
   depositing a magnetic layer on the substrate with an oblique sputtering deposition angle to align a plurality of vacancies in the magnetic layer along a linear row, provide a predetermined anisotropy oriented parallel to the linear row, and reduce atomic mobility of the magnetic layer.

2. The method of claim 1, wherein the oblique sputtering deposition angle onto the cooled substrate is 30 degrees or less with respect to the substrate.

3. The method of claim 1, further comprising treating the magnetic layer with heat for a predetermined amount of time.

4. The method of claim 3, wherein the predetermined anisotropy is maintained after the heat treating step.

5. The method of claim 1, wherein the depositing step induces stress anisotropy in the magnetic layer.

6. The method of claim 1, wherein the oblique sputtering deposition angle varies during the depositing step.

7. The method of claim 1, wherein the magnetic layer comprises a material with a first atomic radius and the magnetic layer is doped with an element with a second atomic radius, the first atomic radius being smaller than the second atomic radius.

8. The method of claim 1, wherein the cryogenic substrate temperature is maintained during the depositing step.

9. The method of claim 3, wherein a plurality of vacancies in the magnetic layer are aligned along a predetermined direction subsequent to heat treatment of the magnetic layer.

10. The method of claim 1, wherein the tuned predetermined anisotropy is above 200 Oe subsequent to heat treatment of the magnetic layer.

* * * * *